United States Patent
Matocha et al.

(10) Patent No.: US 10,361,296 B2
(45) Date of Patent: Jul. 23, 2019

(54) METAL OXIDE SEMICONDUCTOR (MOS) CONTROLLED DEVICES AND METHODS OF MAKING THE SAME

(71) Applicant: Monolith Semiconductor Inc., Round Rock, TX (US)

(72) Inventors: Kevin Matocha, Round Rock, TX (US); Sauvik Chowdhury, Round Rock, TX (US); Kiran Chatty, Round Rock, TX (US); John Nowak, Bertram, TX (US)

(73) Assignee: Monolith Semiconductor Inc., Round Rock, TX (US)

( * ) Notice: Subject to any disclaimer, the term of this patent is extended or adjusted under 35 U.S.C. 154(b) by 0 days.

(21) Appl. No.: 15/636,712

(22) Filed: Jun. 29, 2017

(65) Prior Publication Data

US 2019/0006505 A1     Jan. 3, 2019

(51) Int. Cl.
| | | |
|---|---|---|
| *H01L 31/0312* | (2006.01) | |
| *H01L 29/78* | (2006.01) | |
| *H01L 29/10* | (2006.01) | |
| *H01L 29/06* | (2006.01) | |

(Continued)

(52) U.S. Cl.
CPC .... *H01L 29/7802* (2013.01); *H01L 21/02164* (2013.01); *H01L 21/046* (2013.01);
(Continued)

(58) Field of Classification Search
CPC . H01L 2/02164; H01L 21/046; H01L 21/049; H01L 29/0688; H01L 29/0804
See application file for complete search history.

(56) References Cited

U.S. PATENT DOCUMENTS

| 5,314,834 A | 5/1994 | Mazure et al. |
|---|---|---|
| 6,894,333 B2 | 5/2005 | Shiau |
| (Continued) | | |

FOREIGN PATENT DOCUMENTS

| CN | 102254942 A | 11/2011 |
|---|---|---|
| TW | 200805657 A | 1/2008 |
| (Continued) | | |

OTHER PUBLICATIONS

Decision of Rejection issued by the Intellectual Property Office Taiwan, Republic of China in related Taiwan Patent Application No. 107121085 dated Oct. 15, 2018 (Original Chinese language document and English language translation).

(Continued)

*Primary Examiner* — Samuel A Gebremariam

(57) ABSTRACT

Metal-Oxide-Semiconductor (MOS) controlled semiconductor devices and methods of making the devices are provided. The devices include a gate which controls current flow through channel regions positioned between source/emitter and drain regions of the device. The devices include a gate oxide layer having a variable thickness. The thickness of the gate oxide layer under the edge of the gate and over the source/emitter regions is different than the thickness over the channel regions of the device. The oxide layer thickness near the edge of the gate can be greater than the oxide layer thickness over the channel regions. The source/emitter regions can be implanted to provide enhanced oxide growth during gate oxide formation. The source/emitter region can include regions that are implanted to provide enhanced oxide growth during gate oxide formation and regions which do not provide enhanced oxide growth during gate oxide formation. The devices can be SiC devices such as SiC MOSFETs and SiC IGBTs.

17 Claims, 14 Drawing Sheets

(51) Int. Cl.
    H01L 29/08     (2006.01)
    H01L 29/16     (2006.01)
    H01L 29/167    (2006.01)
    H01L 21/04     (2006.01)
    H01L 21/02     (2006.01)
    H01L 29/66     (2006.01)
    H01L 29/739    (2006.01)
    H01L 29/423    (2006.01)

(52) U.S. Cl.
    CPC ........ *H01L 21/049* (2013.01); *H01L 29/0688* (2013.01); *H01L 29/0804* (2013.01); *H01L 29/0865* (2013.01); *H01L 29/1033* (2013.01); *H01L 29/1095* (2013.01); *H01L 29/167* (2013.01); *H01L 29/1608* (2013.01); *H01L 29/42368* (2013.01); *H01L 29/66068* (2013.01); *H01L 29/7395* (2013.01); *H01L 29/66333* (2013.01); *H01L 29/66712* (2013.01)

(56) References Cited

U.S. PATENT DOCUMENTS

| | | |
|---|---|---|
| 9,035,395 B2 | 5/2015 | Matocha et al. |
| 9,543,451 B2 | 1/2017 | Han |
| 9,583,612 B1 | 2/2017 | Edwards et al. |
| 2002/0197810 A1 | 12/2002 | Hanafi et al. |
| 2005/0082542 A1* | 4/2005 | Sumakeris ............... C30B 29/36 257/77 |
| 2007/0215914 A1 | 9/2007 | Loechelt |
| 2011/0089483 A1 | 4/2011 | Reynes et al. |
| 2013/0256698 A1* | 10/2013 | Sdrulla ................. H01L 21/049 257/77 |
| 2014/0021560 A1 | 1/2014 | Su et al. |
| 2014/0367771 A1 | 12/2014 | Chatty et al. |
| 2015/0221765 A1 | 8/2015 | Zeng et al. |

FOREIGN PATENT DOCUMENTS

| | | |
|---|---|---|
| TW | 201007848 A | 2/2010 |
| TW | M516231 U | 1/2016 |

OTHER PUBLICATIONS

International Search Report and Written Opinion of the International Searching Authority dated Oct. 2, 2018 in International Patent Application No. PCT/US2018/036888.

* cited by examiner

METAL OXIDE SEMICONDUCTOR (MOS) CONTROLLED DEVICES AND METHODS OF MAKING THE SAME

STATEMENT REGARDING FEDERALLY SPONSORED RESEARCH

This invention was made with government support under Grant No. DE-AR0000442 awarded by the Department of Energy. The government has certain rights in the invention.

BACKGROUND

Technical Field

This application relates generally to metal oxide semiconductor (MOS) controlled semiconductor devices and, in particular, to SiC MOS-controlled semiconductor devices.

Background of the Technology

MOS controlled semiconductor devices are based on the insulating properties of the oxide (i.e., $SiO_2$) layer. As with any other dielectric material, there is a maximum field that makes the oxide lose its insulating properties (i.e., breakdown electric field) as it is applied. While MOS devices typically operate at a lower field, if that lower electric field is applied for a long enough time the oxide will slowly degrade (i.e., wear out) and eventually break down. This time dependent dielectric breakdown is an important parameter for MOS controlled device reliability. The problem of time dependent dielectric breakdown has been exacerbated by the drive in the semiconductor industry for ever smaller device geometries.

Accordingly, there still exists a need for MOS controlled semiconductor devices such as SiC devices having improved oxide wear-out lifetime characteristics.

SUMMARY

According to a first embodiment, a semiconductor device is provided which comprises:
a drift layer of semiconductor material of a first conductivity type comprising an upper surface and a lower surface;
a semiconductor substrate in direct or indirect contact with the lower surface of the drift layer;
an oxide layer on and in direct contact with the upper surface of the drift layer;
a gate electrode layer on the oxide layer opposite the drift layer;
wherein the upper surface of the drift layer comprises: one or more JFET regions of a semiconductor material of the first conductivity type; first and second channel regions of a semiconductor material of a second conductivity type different than the first conductivity type opposite and adjacent each of the one or more JFET regions; and first and second source/emitter regions of a semiconductor material of the first conductivity type adjacent the first and second channel regions, respectively, opposite the JFET region;
wherein the oxide layer comprises a central region over the JFET region, first and second inner peripheral regions adjacent the central region and over the first and second channel regions and first and second outer peripheral regions adjacent the first and second inner peripheral regions and opposite the central region;
wherein the gate electrode layer extends over the JFET region and the adjacent channel regions and wherein the gate electrode layer has a first edge on the first outer peripheral region of the oxide layer and a second edge on the second outer peripheral region of the oxide layer;
wherein the oxide layer has a first average thickness in the central region and a second average thickness in the first and second inner peripheral regions, wherein the first average thickness is different than the second average thickness by at least 25%.

According to a second embodiment, a method of making a semiconductor device having an oxide layer of varying thickness is provided which comprises:
implanting a first implant species into a surface of a layer of SiC semiconductor material to form a first region of a first conductivity type;
implanting a second implant species into the surface of the layer of SiC semiconductor material to form a second region of the first conductivity type, wherein the first and second regions have different implant species, different implant levels and/or different levels of implantation induced damage;
forming an $SiO_2$ layer on the first and second regions by exposing the surface of the SiC semiconductor material to an oxidant at an elevated temperature such that $SiO_2$ forms on the first and second regions, wherein the $SiO_2$ forms at a different rate on the first and second regions;
wherein the $SiO_2$ layer is formed on the first and second regions until the difference between a first average thickness in the first region and a second average thickness in the second region is at least 25%.

BRIEF DESCRIPTION OF THE DRAWINGS

The drawings described below are for illustration purposes only. The drawings are not intended to limit the scope of the present teachings in any way.

DETAILED DESCRIPTION

Figure 1:
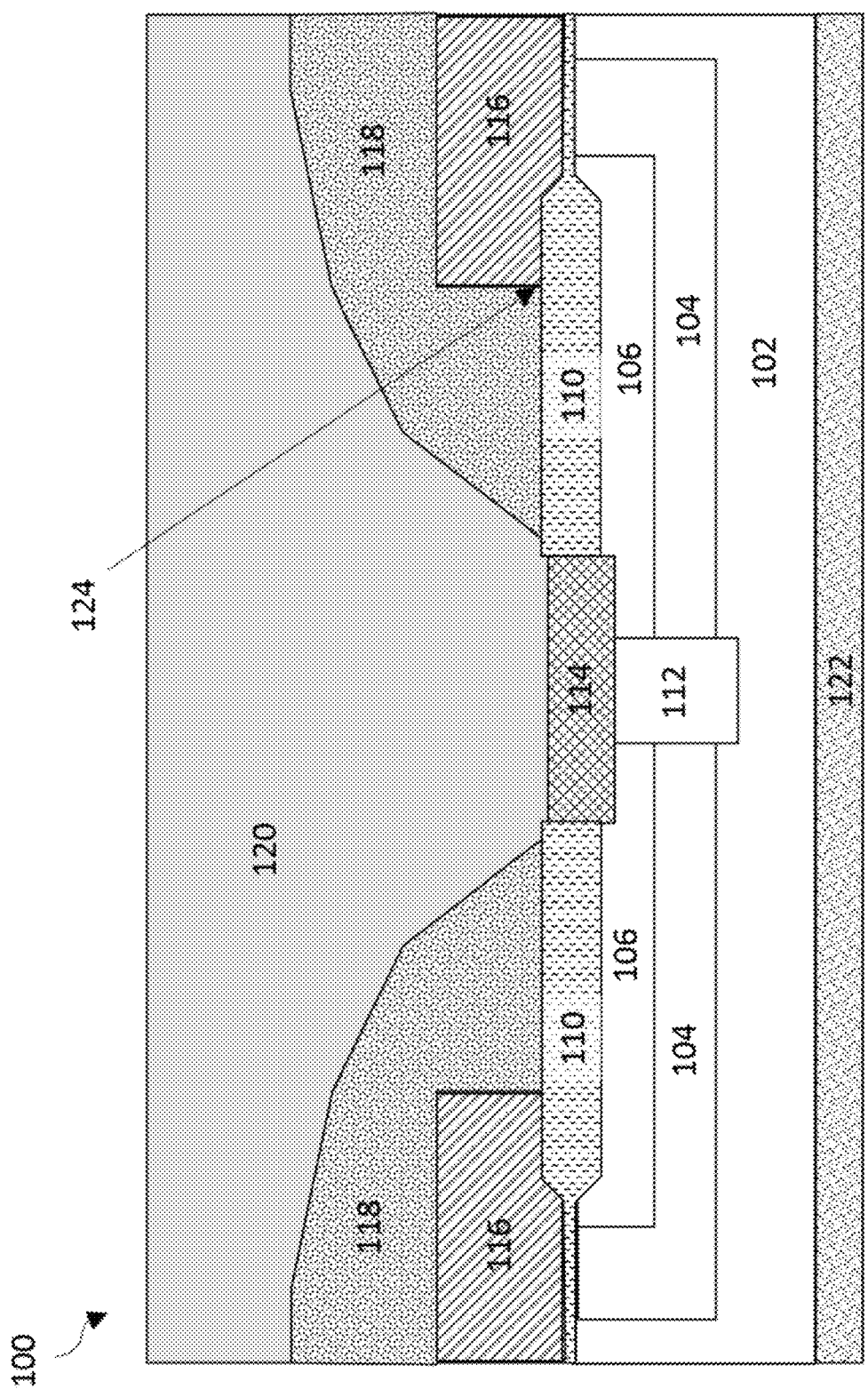
FIG. 1 is a schematic cross sectional view of a MOSFET device having a variable gate oxide thickness according to some embodiments wherein the device has a thicker oxide layer in the gate corner region than in the planar region over the channel.

As used herein, a layer, region or other feature of a semiconductor device which is "on" another layer, region or other feature of the device may be in either in direct contact with the other layer or indirect contact with the other layer, region or feature. When a first layer, region or other feature of a semiconductor device is in indirect contact with another layer, region or other feature, there may be one or more additional layers between the two layers, regions or other features of the device.

As used herein, an average thickness of a layer or region is determined by measuring the thickness at a plurality of locations in the layer or region and dividing by the number of measurements taken.

As used herein, layers, regions or other features of a semiconductor device which are "adjacent" one another are in close proximity. Adjacent layers, regions or other features may be in direct contact (i.e., contiguous) with one another but may also be separated from one another.

As used herein, an "elevated temperature" is a temperature above room temperature.

As used herein, a dimension which is "about" a recited amount means that the dimension has a value that is within +/−10% of the recited amount. For example, a feature which has a length of about 10 µm is from 9-11 µm long.

As used herein, first and second layers, regions or other features of a semiconductor device described as being "opposite and adjacent" another layer, region or feature are on opposite sides of the other layer, region or feature of the device.

MOS-controlled devices with improved gate oxide reliability are described. The devices may be SiC-based devices. Exemplary MOS-controlled devices include but are not limited to a SiC MOSFET and a SiC IGBT. These devices can be vertical or lateral MOS-controlled devices. Methods of making the devices are also provided.

Long term gate oxide reliability is required in MOS controlled semiconductor devices to ensure that the gate oxide does not degrade or destructively fail during the operating conditions, including at high electric field and high temperatures. Several of the main factors that control the oxide reliability wear-out are the concentration of oxide "extrinsic" defects, the oxide electric field and the temperature. First, clean and low-defect processes and tools are required to eliminate or minimize the oxide "extrinsic" defects which contribute to early failure of the gate oxide under the operating conditions. Second, since the oxide wear-out lifetime decreases with increasing gate oxide electric field, to maximize the "intrinsic" oxide lifetime it is preferable to minimize the gate oxide electric field. Due to the relatively poor inversion-layer mobility in SiC MOS-controlled devices, it is often preferable to operate at high gate oxide electric fields in the range of 3-4 MV/cm to minimize the channel resistance. This electric field is estimated by the nominal applied voltage (typically 20 V) divided by the nominal oxide thickness (typically 50 nm). By operating at high electric fields this can reduce the long-term wear-out lifetime of the gate oxide. Additionally, any localized high electric fields in the gate oxide can further reduce the gate oxide wear-out lifetime. Thus, it is important to ensure that the gate oxide electric field is minimized.

The gate oxide thickness of a conventional SiC MOS-controlled devices is mostly uniform. For example, the variation of gate oxide thickness for a conventional SiC MOS-controlled devices is typically less than 25% across the main channel region of the device to the end of the gate electrode. The gate oxide can be considered to consist of two general regions: a "planar" or central region over the channel and JFET regions of the device, and a peripheral region under the corner or edge of the gate electrode adjacent the source/emitter contact. In the planar region, the gate oxide electric field is nominally defined by the gate voltage divided the gate oxide thickness. Typical SiC MOS-controlled devices operate at 3 to 4 MV/cm. The gate electrode corner can induce a high electric field in the gate oxide at the end of the gate electrode. The electric field in gate electrode corner region can be significantly higher than the electric field in the planar region. While not wishing to be bound by any theory, the high electric field at the gate electrode corner can limit the wear-out lifetime of the MOS-controlled device.

According to some embodiments, a SiC MOS-controlled device having a gate oxide layer with a variable thickness is provided. According to some embodiments, the device has a thicker gate oxide under the gate electrode corner adjacent the ohmic contact for the source region. According to some embodiments, the gate oxide thickness in the planar region under the gate electrode has a thickness greater than the thickness of the gate oxide layer in the gate electrode corner region.

By providing a gate oxide thickness in the gate electrode corner region having a thickness greater than the gate oxide thickness in the planar region, the maximum gate oxide electric field at the gate corner can be reduced thereby providing devices with improved gate oxide reliability and a longer gate oxide mean time to failure.

FIG. 1 is a schematic cross sectional view of a MOSFET device 100 having a variable gate oxide thickness according to some embodiments wherein the device has a thicker oxide layer in the gate corner region than in the planar region over the JFET and channel regions. As shown in FIG. 1, drift layer 102 is formed on substrate 122. P-well region 104 is formed in drift layer by ion implantation. Source-emitter region 106 is formed in p-well region 104 spaced from the edges of the p-well region to form p-type channels. JFET regions are on the left and right side of the drawing adjacent the p-channel regions opposite the source/emitter region 106. Gate oxide layer 110 is formed on exposed surfaces of the source/emitter region 106, channel and JFET regions. As shown in FIG. 1, gate oxide layer 110 is thicker over source/emitter region 106. P+ region 112 is formed in center of source/emitter region 106 and p-well region 104. Ohmic contact 114 is shown in source/emitter region 106 and p+ region 112. Gate electrode 116, interlayer dielectric 118 and source metal 120 are also shown. The corner 124 of the gate electrode is also shown in FIG. 1. As can be seen in FIG. 1, the gate oxide layer 110 is thicker under gate electrode corner 124 than over the channel and JFET regions of the device.

A method of making a SiC MOS-controlled device having a gate oxide layer with a varying thickness as described above is also provided. According to some embodiments, the device is a vertical MOSFET device and the starting material can be an n+ SiC substrate with an n-type SiC epilayer formed on the n+ SiC substrate. According to some embodiments, a p-well region is patterned and implanted in an n-type drift layer on a semiconductor substrate. The p-well may be patterned using an oxide mask. Then, the source region can be patterned and implanted in the p-well region using an oxide and/or photoresist mask. According to some embodiments, the source region implant species may comprise Nitrogen and Phosphorus with a dose greater than $4 \times 10^{14}$ cm$^{-2}$. According to some embodiments, the source region implant may include other species such as Si or C or other inert species such as Ar. The source implantation can include a combination of implant species with different implant doses and implant energies. The combination of implant species, implant energy and implant dose can be selected to enhance the oxidation rate in the source implant region. While not wishing to be bound by any theory, the increase in implantation-induced damage and/or the high n-type doping concentration may accelerate the oxidation rate in the n-plus implanted region. Then, p-plus regions are patterned and implanted. Other regions of the device (not shown in FIG. 1) may be implanted with n-type and p-type regions to form the MOS-controlled device structure, including termination and field stop regions or other regions. Then, the sample is annealed at temperatures >1600° C. to activate the implanted regions. Next, the field oxide is deposited, patterned and etched. Next, the gate oxide is grown by thermal oxidation of the SiC surface. The gate oxide thickness varies across the sample, based upon the presence of the implant-damaged region and the presence of a high concentration n-plus dopant species. In one embodiment, the gate oxide thickness is nominally 50 nm in the planar gate oxide region and the gate oxide thickness is 150 nm in the region toward the edge of the gate electrode. The shape of the gate oxide transition between the planar region and the n-plus region is a smooth transition, and the gate oxide in the n-plus regions is "recessed", that is, it extends below the surface of the SiC in the planar region. This recessed gate oxide structure with an increased thickness on one side is sometimes referred to as a "birds-beak".

According to some embodiments, the device is a vertical IGBT and the starting material can be an n+ SiC substrate with a p-type SiC layer formed on the substrate and an n-type SiC layer formed on the p-type SiC layer. The n-type and p-type layers can be formed by epitaxial growth.

Figure 2:
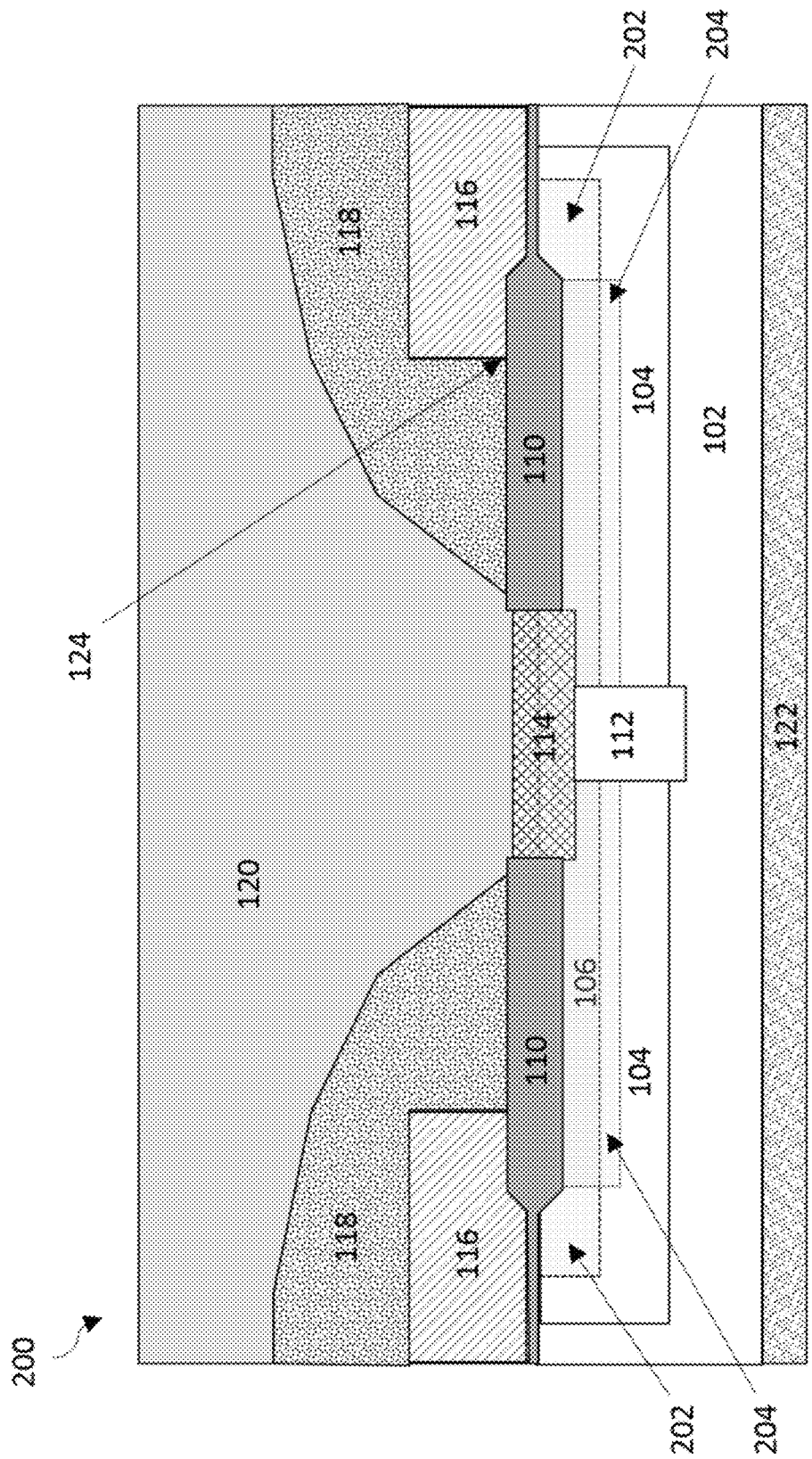
FIG. 2 is a schematic cross sectional view of a MOSFET device having a variable gate oxide thickness according to some embodiments wherein the device has a thicker oxide layer in the gate corner region than in the planar region over the channel and wherein the device has two different source implant regions.

FIG. 2 is a schematic cross sectional view of a MOSFET device 200 having a variable gate oxide thickness according to some embodiments wherein the device has a thicker oxide layer in the gate corner region than in the planar region over the JFET and channel regions and wherein the device has two different source implant regions. As shown in FIG. 2, the device has first 202 and second 204 source/emitter implant regions. As can be seen in FIG. 2, the gate oxide layer 110 is thicker under gate electrode corner 124 over second source/emitter region 204 than over the channel and JFET regions of the device.

Figure 3A:
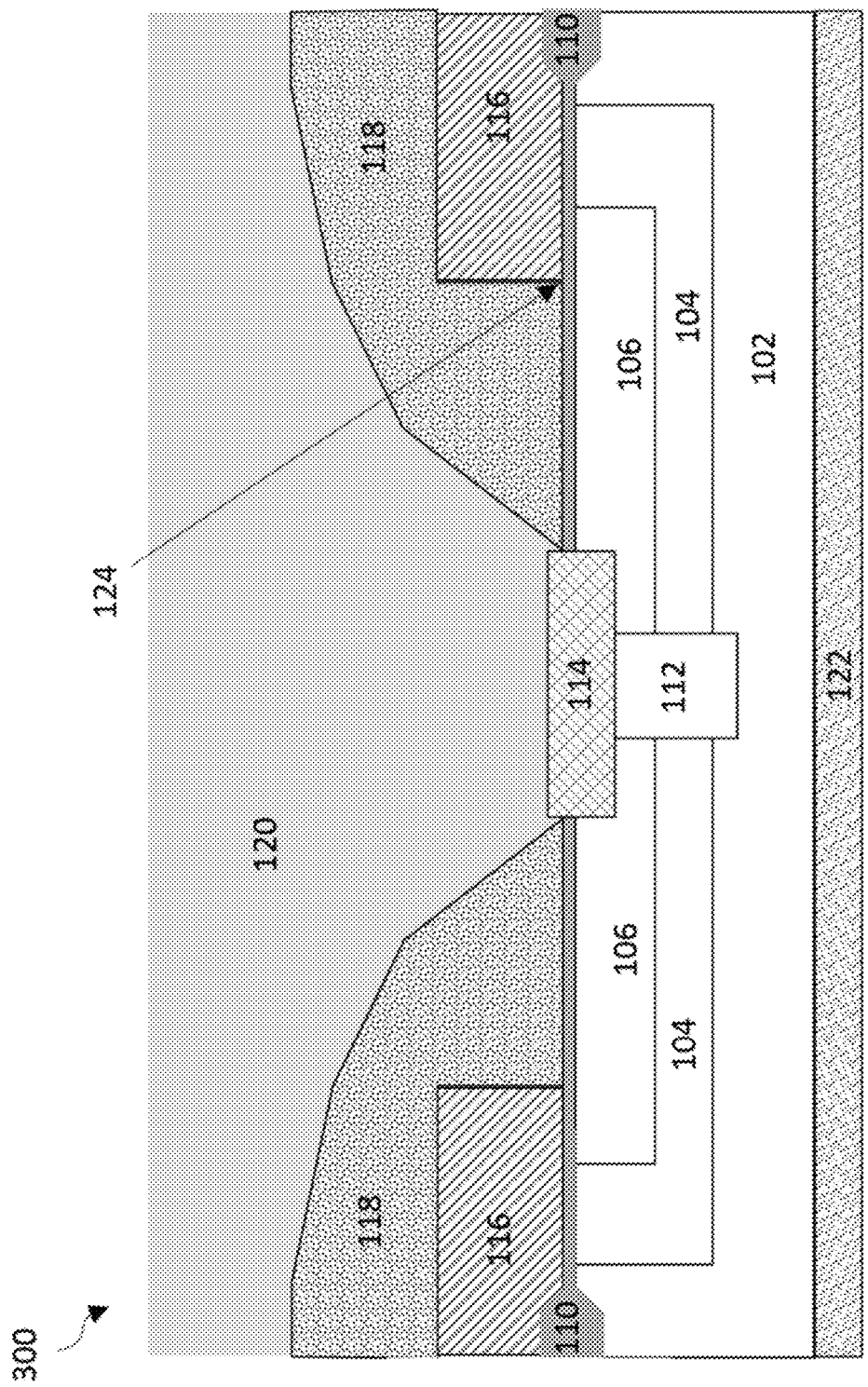
FIG. 3A is a schematic cross sectional view of a MOSFET device having a variable gate oxide thickness according to some embodiments wherein the device has a thicker oxide layer in the planar region over the channel than in the gate corner region.

FIG. 3A is a schematic cross sectional view of a MOSFET device 300 having a variable gate oxide thickness according to some embodiments wherein the device has a thicker gate oxide layer 110 in the planar region over the JFET and channel regions than in the gate corner region under gate corner 124. As can be seen in FIG. 3, the gate oxide layer 110 is thicker over the JFET region of the device than it is under gate electrode corner 124.

Figure 3B:
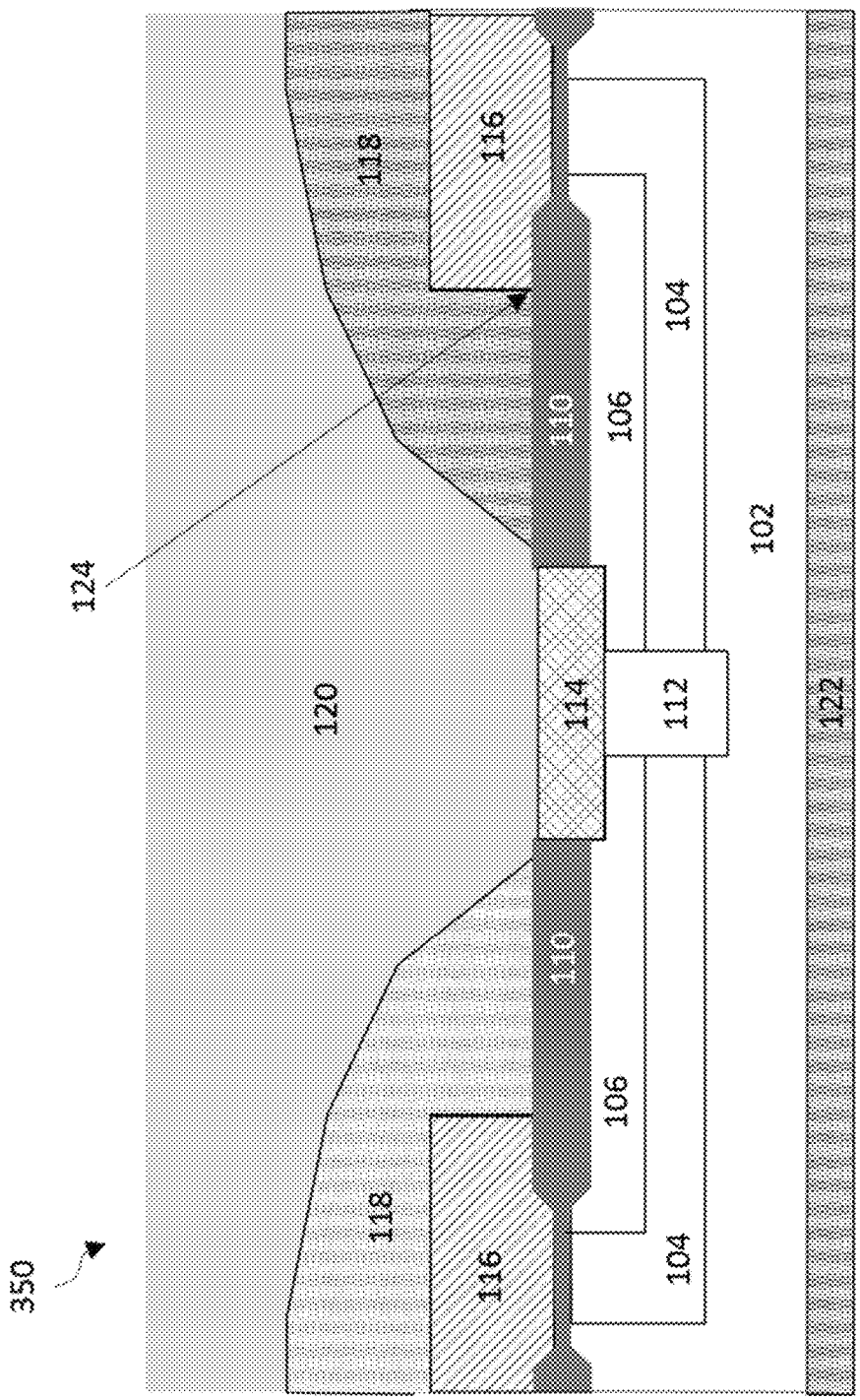
FIG. 3B is a schematic cross sectional view of a MOSFET device having a variable gate oxide thickness according to some embodiments wherein the device has a thicker oxide layer in the gate corner region and in the planar region over the channel and wherein the oxide layer is thinner over the P-well region which forms the channel of the device.

FIG. 3B is a schematic cross sectional view of a MOSFET device 350 having a variable gate oxide thickness according to some embodiments wherein the device has a thicker oxide layer 110 in the gate corner region 124 and over the JFET region and wherein the oxide layer is thinner over the P-well region 104 which forms the channel of the device.

A method of making a SiC MOSFET device having a variable gate oxide thickness according to some embodiments is depicted in FIGS. 4A-4M. The cross section is shown in the active area of the device. The method depicted in FIGS. 4A-4M can be used to make a device as depicted in any of FIGS. 1-3 above.

Figure 4A:
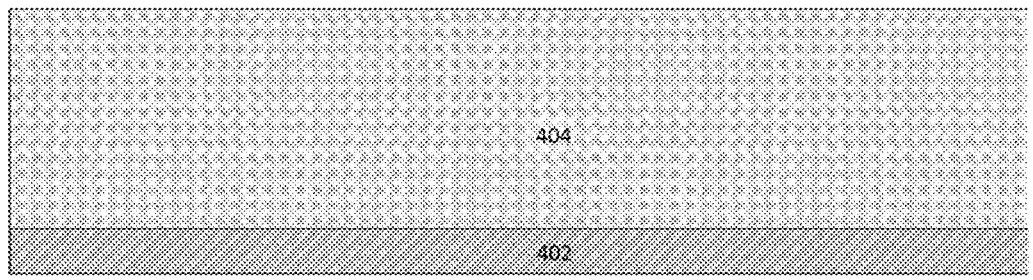
FIGS. 4A-4M are schematics illustrating a method which can be used to make a MOS-controlled device having a variable gate oxide thickness.

As shown in FIG. 4A, a drift layer 404 is formed on a semiconductor substrate 402. The drift layer may be formed via epitaxial growth of semiconductor material on semiconductor substrate 402. The exposed surface of the drift layer corresponds to the front side of the device whereas the exposed surface of the substrate corresponds to the back side of the device.

Figure 4B:
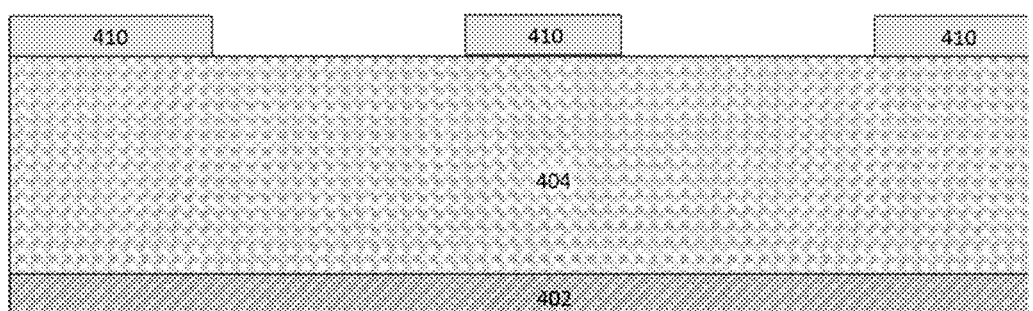
Figure 4C:
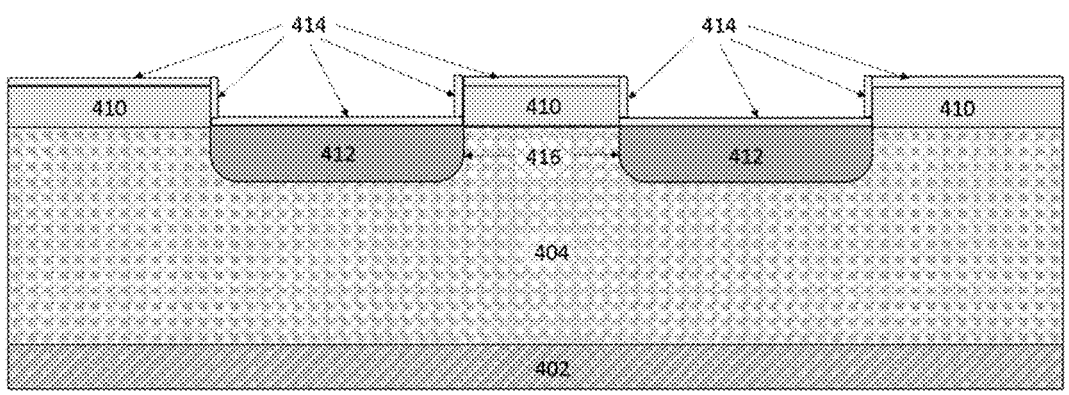

As shown in FIG. 4B, a layer of $SiO_2$ 410 can then be deposited and patterned and etched on the front side of the device to form openings for implantation of the p-well regions. As shown in FIG. 4C, a screening oxide layer 414 can then be deposited on the front side of the device and the p-well regions 412 implanted through the openings in the layer of $SiO_2$ 410. The distance between the edges of the p-well regions 416 is also shown in FIG. 4C. According to some embodiments, this distance 416 can be 1 to 5 µm. According to some embodiments, this distance 416 can be 1.5 to 4 µm. According to some embodiments, this distance 416 can be about 2.4 µm.

Figure 4D:
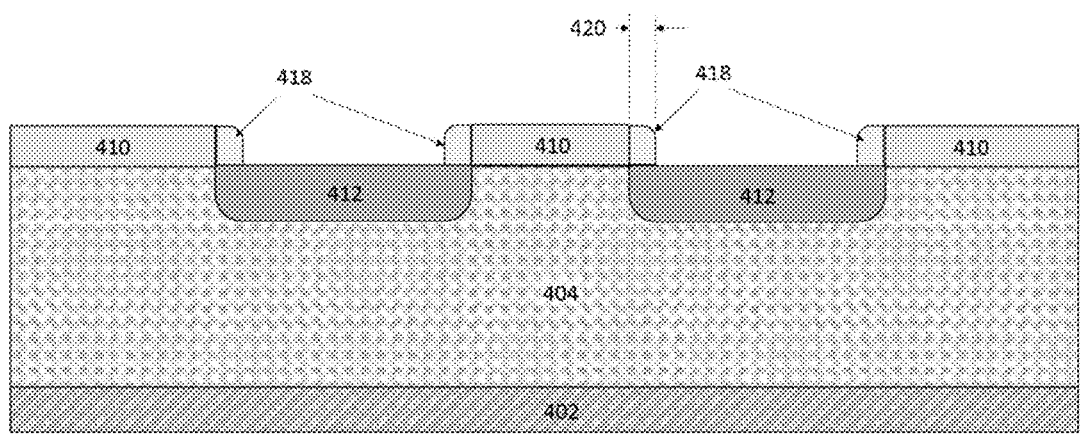

As shown in FIG. 4D, a sidewall layer 418 can then be formed on the sidewalls of the openings in the layer of $SiO_2$ 410. Sidewall layer 418 can be formed by depositing a layer of $SiO_2$ on the front side of the device and anisotropically etching to selectively remove the deposited layer from the upper surface of layer of $SiO_2$ 410. The width 420 of spacer 418 is also shown in FIG. 4D. According to some embodiments, width 420 can be 0.7 µm to 0.8 µm.

Figure 4E:
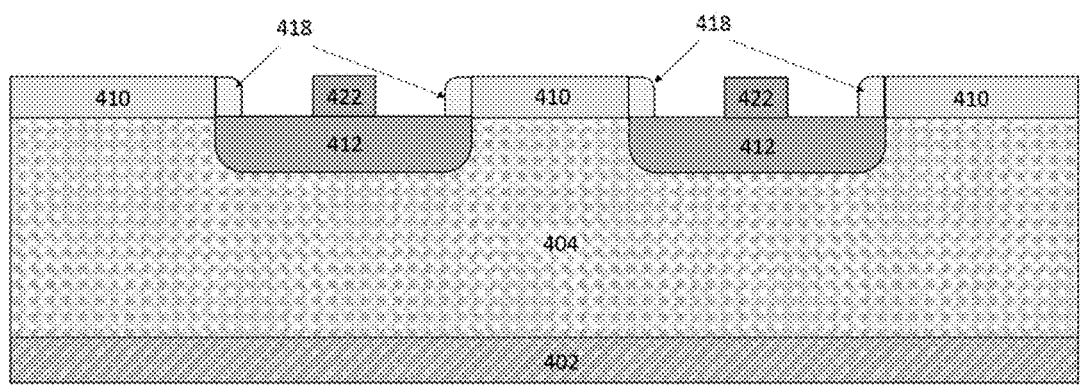

As shown in FIG. 4E, a photoresist or other n-type blocking material 422 can then be patterned on the front side of the device to block implantation of portions of the P-type well regions with n-type dopants. The n-type blocking material 422 is not required and the p-type regions 432 can be implanted over the n-type regions.

Figure 4F:
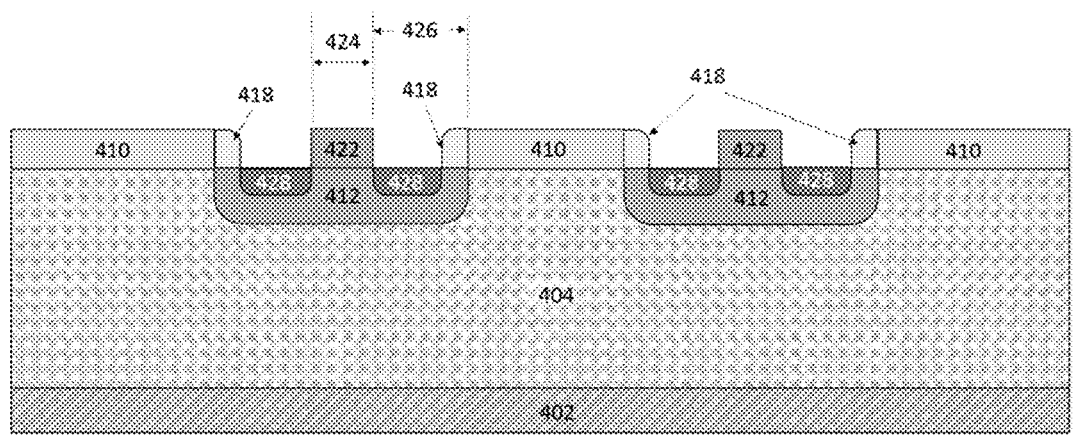

As shown in FIG. 4F, n-type dopants are then implanted in the exposed p-well regions 412 to form n-type regions 428. The n-type regions 428 can be formed as described above using a combination of implant species, dosage and energy to enhance SiC oxidation in the n-type regions during gate oxide formation to provide a device as depicted in FIG. 1. Dual n-type regions can also be formed to provide a device as depicted in FIG. 2. A method for forming dual implanted regions is described below and depicted in FIGS. 5A-5G. The width 424 of the n-type blocking material and the distance between the edge of the n-type blocking material and the edge of the p-well region 426 are shown in FIG. 4F.

Figure 4G:
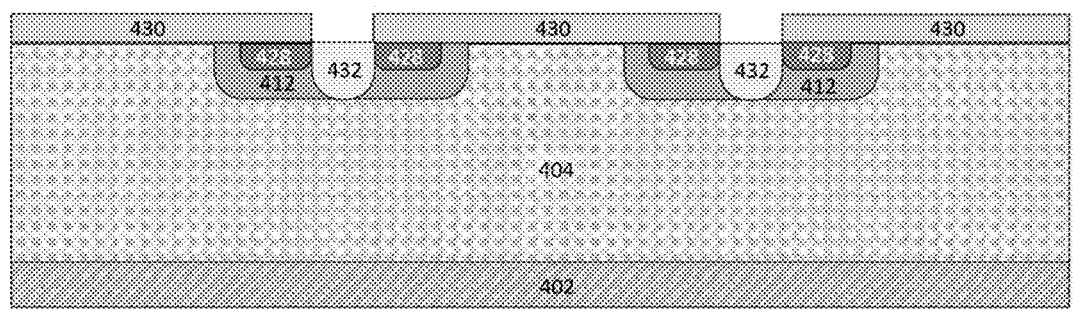

As shown in FIG. 4G, the photoresist and oxide layers are removed from the front side of the device and an $SiO_2$ layer 430 is deposited, patterned and etched to form openings for the implantation of p+ regions 432.

Figure 4H:
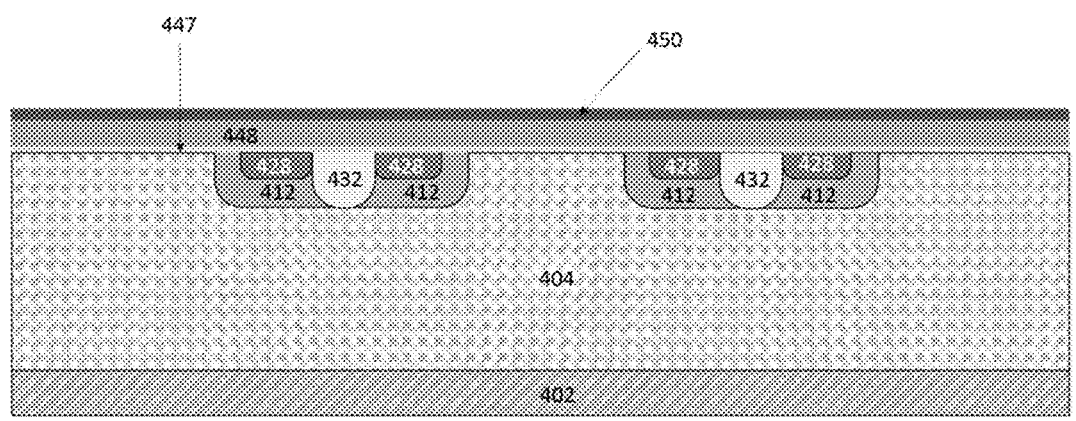

As shown in FIG. 4H, gate oxide layer 447 can then be formed. As set forth above, n-type regions 428 can be formed using a combination of implant species, dosage and energy to enhance SiC oxidation in the n-type regions 428 during gate oxide formation. As a result, a thicker gate oxide layer is formed over n-type regions 428 than over the JFET and channel regions of the device as shown in the device depicted in FIG. 1.

As also shown in FIG. 4H, after formation of the gate oxide layer, the gate electrode is formed. The gate electrode layers can include a polysilicon layer 448 and a silicide layer 450. The silicide layer 450 can be a $WSi_2$ layer formed by, for example, sputtering. $WSi_2$ is merely an exemplary silicide material and other materials can be used.

Figure 4I:
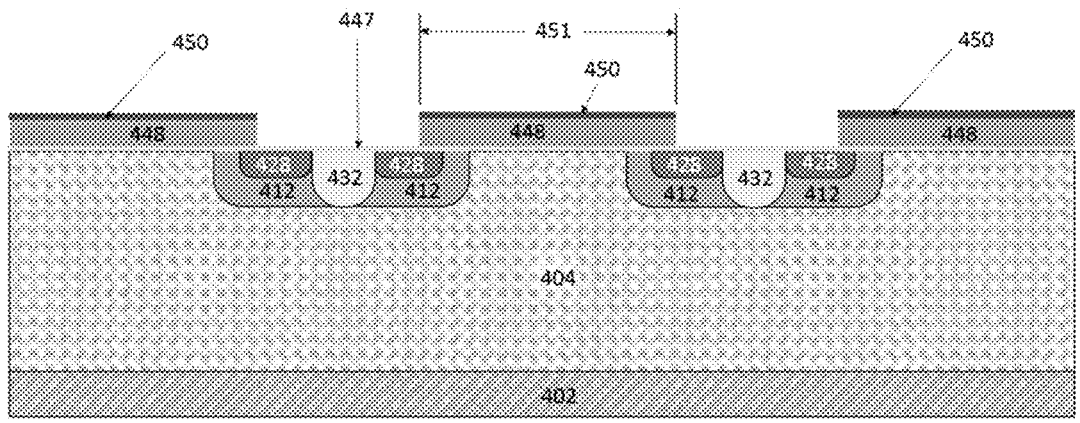

As shown in FIG. 4I, the silicide 450 and polysilicon 448 layers are selectively etched to form the gate electrode. As shown in FIG. 4I, the gate electrode has a width dimension 452. According to some embodiments, the width dimension 451 of the gate electrode can be about 4.5 µm.

Figure 4J:
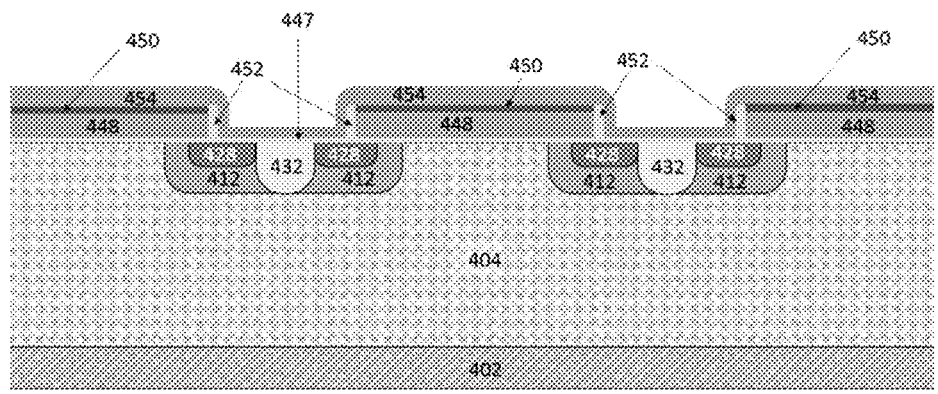

As shown in FIG. 4J, sidewall spacers 452 can then be formed on the sidewalls of the gate electrode followed by deposition of the interlayer dielectric (ILD) material 454. Although sidewall spacers 452 are shown in FIG. 4J, the sidewall spacers 452 are not required.

Figure 4K:
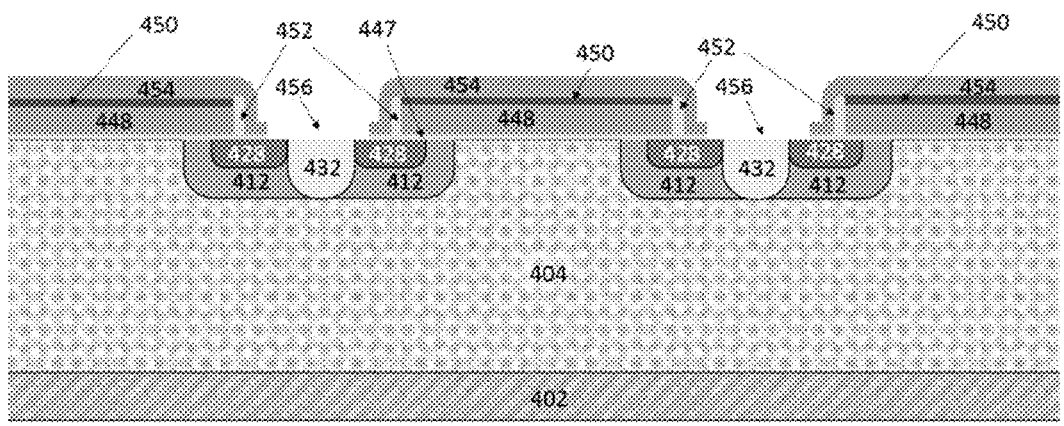
Figure 4L:
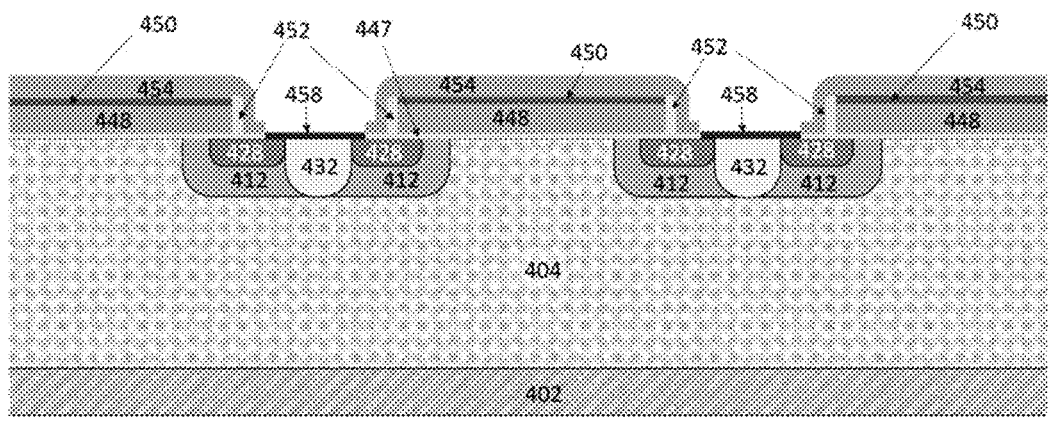

As shown in FIG. 4K, the ILD material 454 can be selectively removed to form openings 456 over the p-type region 432 and over adjacent source regions 428. As shown in FIG. 4L, source ohmic contacts 458 can then be formed in openings 456. Source ohmic contacts 458 can be formed by depositing Ni and annealing to form a silicide contact.

Figure 4M:
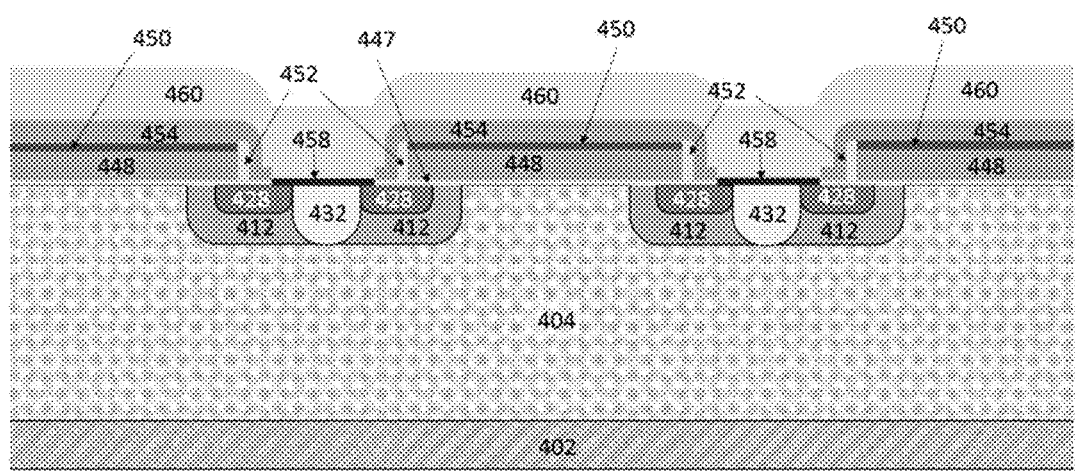

As shown in FIG. 4M, source metal 460 can then be deposited. A drain ohmic contact can also be formed on the back side of the substrate 402 (not shown). The drain ohmic contact can be formed by depositing a Ni layer and annealing. Gate contacts can also be formed (not shown). A backside metal can then be deposited.

The device can include a central active region, a termination region surrounding the active region and a die seal region surrounding the termination region. The central active region of the device can include a plurality of source regions and gate electrode regions. The source regions and gate electrode regions can be elongated regions (i.e., fingers) extending in an x-direction and spaced apart in a y-direction perpendicular to the x-direction. For example, the cross-section shown in FIGS. 4A-4M can be a cross-section taken through the device in a plane formed by the y and z axes of an x-y-z coordinate axis system wherein the z axis extends in the thickness direction (i.e., through the device thickness from the front side to the back side), the y axis extends laterally across the device from the active region to the die seal region and the x axis extends into the page. The source metal 460 can contact each of the plurality of source regions 428 via ohmic contacts 458 formed on each of the source regions. The device can include a gate runner (not shown) extending in the y-direction and connecting the plurality of gate regions together.

When utilizing a high-dose ion implant for the source/emitter regions of the device, the increased oxide thickness may cause a detrimental effect by providing a thicker gate oxide in the channel region near the source. According to some embodiments, two different source implant regions are provided wherein the two regions are spaced apart from one another.

In this embodiment, the p-well is first patterned and formed by ion implantation. The p-well implantation may be performed at room temperature or a temperature up to 650° C. The p-well mask could be formed by a dielectric mask, comprising silicon nitride or silicon dioxide, or could be formed by a polysilicon layer or a photoresist. Then the first source implant is patterned and implanted a distance away from the edge of the p-well region to form the channel region. This first source implant pattern may be self-aligned. The self-alignment method for the first source implant can be performed by depositing a layer on top of the p-well mask and anisotropically etching down to the surface to leave a spacer. Alternately, this self-aligned spacer for the first source implant could be formed by oxidation of a polysilicon layer used to mask the p-well implant. Other self-aligned techniques can also be used. The first source implant can be performed with an implant schedule of energy and dose such that the oxidation rate is not increased in this region. In one embodiment, this dose is less than $3 \times 10^{14}$ cm$^{-2}$. This first source implant species can be Nitrogen or Phosphorus. This first source implant may be performed at room temperature or at temperatures up to 650° C. Next a second source implant is patterned a distance away from the first source region and implanted with a higher dose that will cause an increase in the oxidation rate over the second source region. This second source implant pattern may be self-aligned. The self-alignment method for the second source implant can be performed by depositing a layer on top of the first source implant mask and anisotropically etching down to the surface to leave a spacer. Alternately, this self-aligned spacer for the second source implant could be formed by oxidation of a polysilicon layer used to mask the p-well implant or the first source implant. Other self-aligned techniques can also be used. In one embodiment the second implant species is Nitrogen or Phosphorus. The second source implant dose may be in a dose range of $5 \times 10^{14}$ cm$^{-2}$ to $1 \times 10^{16}$ cm$^{-2}$. This second source implant may be performed at room temperature or at temperatures up to 650° C. Standard procedures can then be used to finish the device structure. Due to the increased dose in the second source implant region, this embodiment may provide a decrease in sheet resistance and contact resistance of the second source region. The second source implant may be implanted to a depth that is shallower, the same, or deeper than the first source implant depth.

A method of making a SiC MOSFET device having a variable gate oxide thickness and comprising two different source implant regions is depicted in FIGS. 5A-5G. The cross section is shown in the active area of the device. The device can include a plurality of additional p-well regions and source/emitter regions in the active area of the device.

Figure 5A:
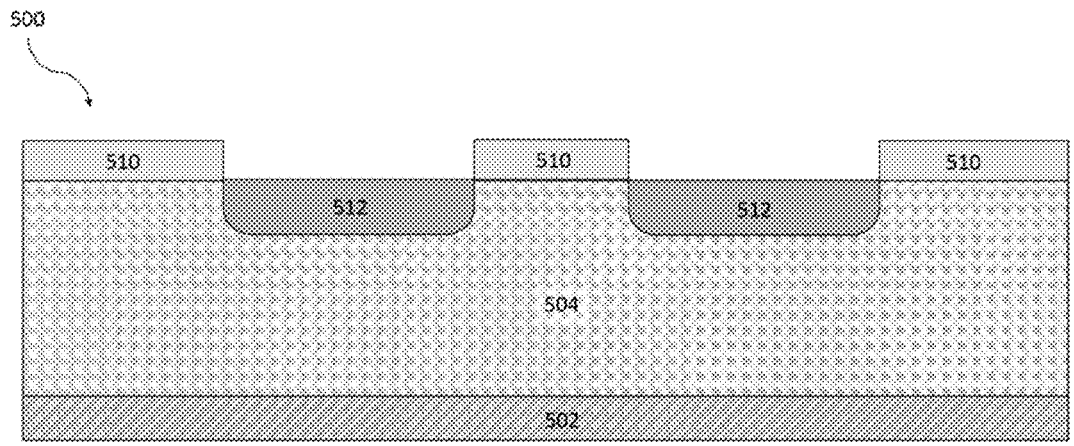
FIGS. 5A-5G are schematics illustrating a method of making a MOS-controlled device having a variable gate oxide thickness wherein the device comprises two different source implant regions.
Figure 5B:
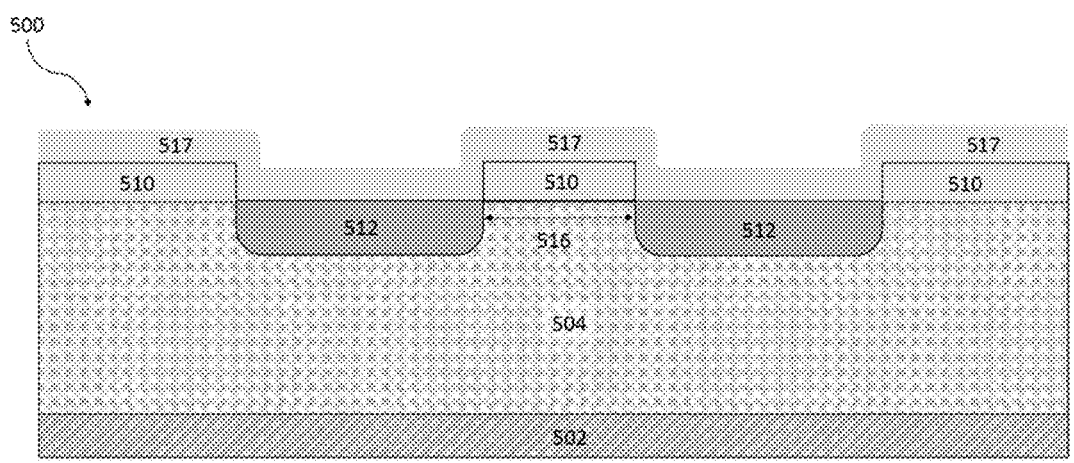

As shown in FIG. 5A, a drift layer 504 is formed on a semiconductor substrate 502. The drift layer may be formed via epitaxial growth on the substrate. The exposed surface of the drift layer corresponds to the front side of the device whereas the exposed surface of the substrate corresponds to the back side of the device. As shown in FIG. 5A, a layer of SiO$_2$ 510 can be deposited and patterned and etched on the front side of the device to form openings for implantation of the p-well regions 512. The distance 516 between the p-well regions is shown in FIG. 5B. According to some embodiments, this distance 516 can be 1 to 5 µm. According to some embodiments, this distance 516 can be 1.5 to 4 µm. According to some embodiments, this distance 516 can be about 2.4 µm.

Figure 5C:
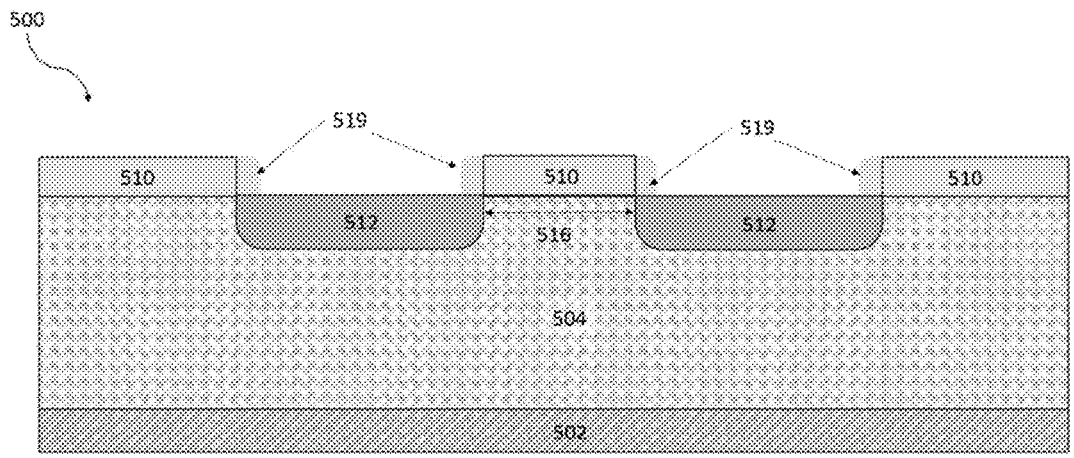

As shown in FIGS. 5B and 5C, spacers 519 can be formed on the sidewalls of the SiO$_2$ layer 510 by depositing a layer of SiO$_2$ 517 on the front side of the device and anisotropically etching SiO$_2$ layer 517 to selectively remove SiO$_2$ from the upper surfaces of layer 510. Although not shown, a photoresist or other n-type blocking layer can be deposited on SiO$_2$ layer 517 and selectively removed such that a portion of the n-type blocking layer remains in a central portion of p-well 512 to prevent etching of the underlying SiO$_2$ layer 517 during anisotropic etching. In this manner, SiO$_2$ remains after anisotropic etching serving as an n-type implant blocking material.

Figure 5D:
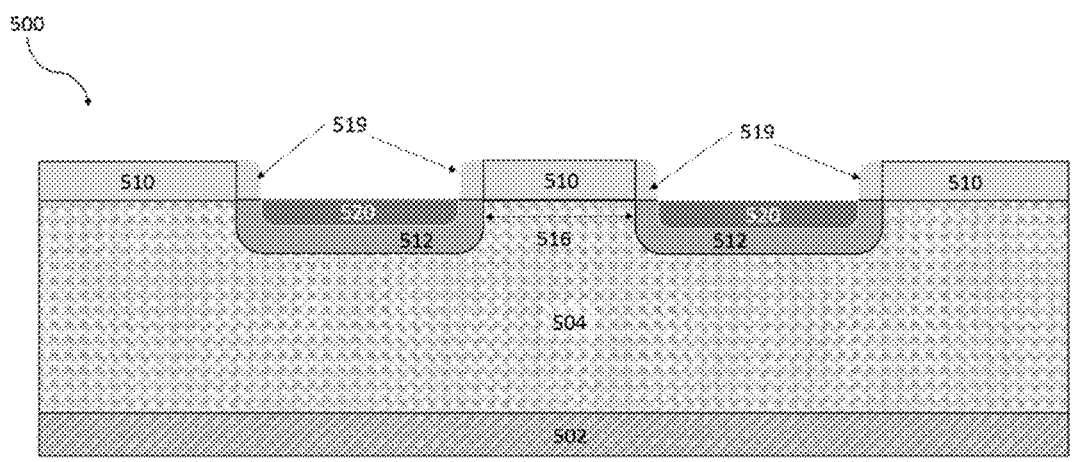

As shown in FIG. 5D, first source implant regions 520 can then be formed in p-well regions 512. As can be seen in FIG. 5D, spacers provide p-type regions between the first source regions 520 and the JFET region of the device. These p-type regions form the device channels. According to some embodiments, the dopant implanted to form first source/emitter regions 512 comprises nitrogen.

Figure 5E:
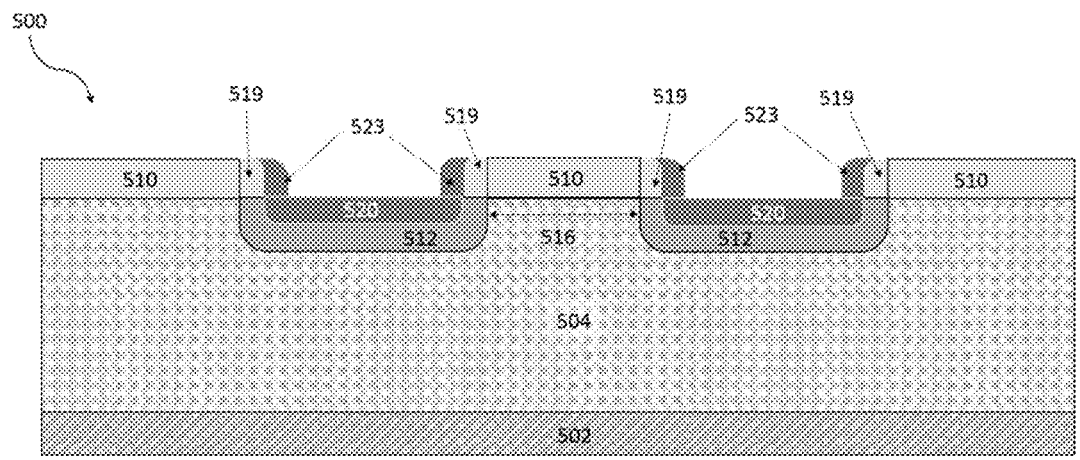
Figure 5F:
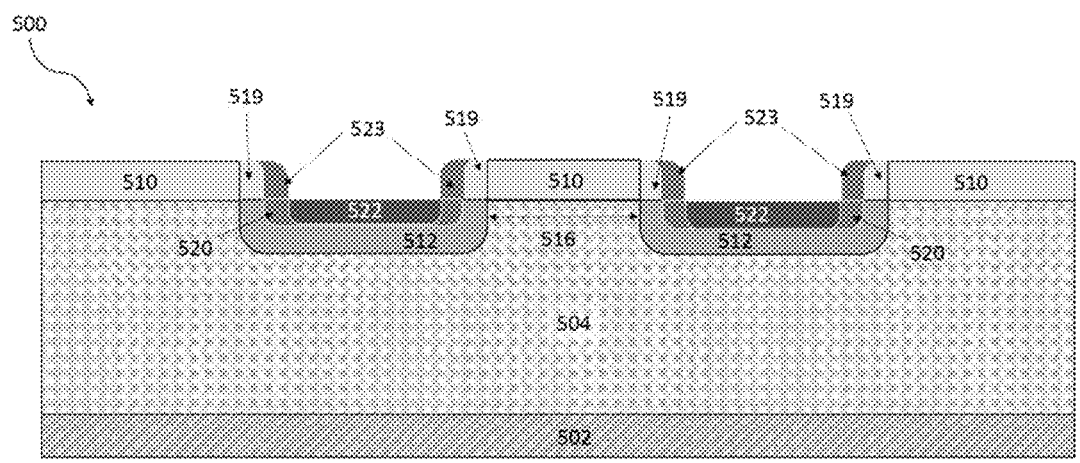
Figure 5G:
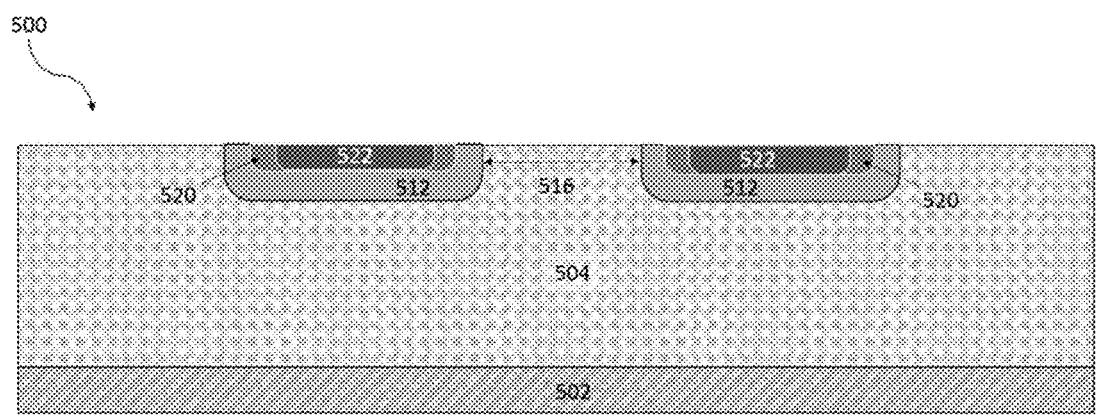

As shown in FIG. 5E, second spacers 523 can be formed on first spacers 519 and on the blocking material 521 on the p-well. Second spacers 523 can be formed by depositing SiO$_2$ and anisotropically etching. As shown in FIG. 5F, second source regions 522 can then be formed in first source regions 520. According to some embodiments, the dopant implanted to form second source/emitter regions 522 comprises phosphorous. SiO$_2$ is then removed from the front side of the device as shown in FIG. 5G. The device is then ready for further processing, including the formation of the gate oxide layer.

An MOS-controlled semiconductor device having a variable oxide thickness as depicted in FIG. 1 was manufactured using the techniques described above. A cross-section of the device through the gate oxide layer was used to measure the gate oxide thickness in various regions of the gate oxide layer. The measurements show that the oxide thickness increased from about 0.05 μm in the planar region of the device (e.g., over the JFET and channel regions) to approximately 0.15 μm toward the edge of the polysilicon gate electrode (i.e., in the corner region under the edge of the gate electrode). The measurements also showed that the oxide layer extended approximately 0.075 μm (i.e., about half the thickness of the gate oxide layer in this region) below the surface of the SiC in the corner region.

According to some embodiments, an MOS-controlled semiconductor device having a variable oxide thickness is provided wherein the gate oxide is thicker in the JFET region of the device. A device of this type is shown in FIG. 3. According to some embodiments, an increase in the gate oxidation rate can be provided through ion-implantation of implant species in the JFET region of the device. While not wishing to be bound by any theory, ion implantation and related implant damage may cause an increase in the oxidation rate of the semiconductor material in the JFET region of the device. The semiconductor material may be silicon carbide. The device may be a MOSFET device.

Either all or a portion of the JFET region may be implanted through ion implantation to increase the oxidation rate during gate oxide formation. According to some embodiments, the implant species may be an electrically active, an electrically inactive species or combinations thereof. Exemplary electrically active species include but are not limited to nitrogen, phosphorus, boron and aluminum or other elements. Electrically inactive species include but are not limited to silicon, carbon, argon or other elements that do not modify the electrical properties of the underlying semiconductor substrate. According to some embodiments, the ion implant dose may be larger than $1\times10^{14}$ cm$^{-2}$. According to some embodiments, the ion implant dose may be larger than $1\times10^{15}$ cm$^{-2}$. According to some embodiments, the ion implantation dose is in the range of $2\times10^{15}$ cm$^{-2}$ to $8\times10^{15}$ cm$^{-2}$.

Under subsequent gate oxidation processing, the region of the semiconductor surface that underwent the ion implantation as describe above has a faster oxidation rate than other regions of the semiconductor surface. After gate oxidation, a thicker oxide layer is present in the implanted region of the semiconductor surface, compared to the other regions. While not wishing to be bound by theory, the presence of a thicker oxide in the central region of the gate electrode can reduce the electric field present in the oxide in this region during the off-state of the device, thereby improving stability and reliability of the device.

Various exemplary embodiments of a metal oxide controlled semiconductor device having a gate oxide layer with a variable thickness are described below. These embodiments are exemplary only and are not intended to be limiting in any way.

According to some embodiments, a semiconductor device structure is provided wherein a thermal oxide is formed on a SiC layer having a variable thickness. According to some embodiments, the thickness of the dielectric underneath the edge of the gate electrode (i.e., the gate corner) is thicker than the gate oxide thickness in the channel region (i.e., the planar gate oxide region). According to some embodiments, the thickness of the dielectric in a central portion of the gate region is thicker than gate oxide thickness in the channel region.

According to some embodiments, the SiC semiconductor surface can be recessed based on the variation in oxide thickness. According to some embodiments, the oxide thickness at the gate corner region can be greater than 125% of the gate oxide thickness in the planar gate oxide region.

According to some embodiments, the device comprises source/emitter implanted regions. According to some embodiments, the source implant species is Nitrogen, Phosphorus or combinations thereof. The source implant dose can be in the range of $1\times10^{15}$ cm$^{-2}$ to $1\times10^{16}$ cm$^{-2}$. The source implant can be phosphorus with an implant dose in the range of $3\times10^{15}$ cm$^{-2}$ to $8\times10^{15}$ cm$^{-2}$.

According to some embodiments, the SiC can be implanted with an electrically inactive species. According to some embodiments, the SiC can be implanted with an electrically active (i.e., dopant) species. According to some embodiments, the SiC can be implanted with the following species in the region under the gate: nitrogen, phosphorus, silicon, carbon, argon and combinations thereof.

According to some embodiments, the gate oxide thickness in the region toward the edge of the gate (i.e., the gate corner region) is more than 125% of the thickness in the channel region (i.e., the planar gate oxide region).

According to some embodiments, the device is a silicon carbide MOS-controlled device. According to some embodiments, the device is a SiC MOSFET device. According to some embodiments, the device is a SiC IGBT device.

According to some embodiments, first and second source implant regions are formed, spaced apart from each other, and an oxide layer is grown on the first and second source implant regions such that the gate oxide layer forms at a greater thickness where the second source implant is performed. The first and second source implant regions can be n-type regions. According to some embodiments, the implant dose for the first source region can be in the range of between $2\times10^{14}$ cm$^{-2}$ and $9\times10^{14}$ cm$^{-2}$. The first source implant species can be Nitrogen, Phosphorus or a combination thereof. The implant dose for the second source region can be in the range of $1\times10^{15}$ cm$^{-2}$ to $1)(10^{16}$ cm$^{-2}$. The second source implant species can be Nitrogen, Phosphorus or a combination thereof. The oxide thickness over the second source implant can be greater than 125% of the gate oxide thickness over the first source implant. The first source implant and second source implant can be spaced apart by 0.1 μm to 0.5 μm. The first source implant and second source implant can be spaced apart by 0.1 μm.

According to some embodiments, the first and second course implant regions can be n-type semiconductor regions formed in a well region of a p-type semiconductor material (i.e., p-well region). The first source implant can be self-aligned to the p-well region. The second source implant region can be self-aligned to the first source implant region. The second source implant can be implanted shallower than the implant depth first source implant. The second source implant can be implanted to the same depth as the implant depth of the first source implant. The second source implant can be implanted to a depth deeper than the implant depth of the first source implant.

While the foregoing specification teaches the principles of the present invention, with examples provided for the purpose of illustration, it will be appreciated by one skilled in the art from reading this disclosure that various changes in form and detail can be made without departing from the true scope of the invention.

What is claimed is:

1. A semiconductor device comprising:
a drift layer of a semiconductor material of a first conductivity type comprising an upper surface and a lower surface;
a semiconductor substrate in direct or indirect contact with the lower surface of the drift layer;
an oxide layer on and in direct contact with the upper surface of the drift layer;
a gate electrode layer on the oxide layer opposite the drift layer; wherein the upper surface of the drift layer comprises:
one or more JFET regions of a semiconductor material of the first conductivity type; first and second channel regions of a semiconductor material of a second conductivity type different than the first conductivity type opposite and adjacent each of the one or more JFET regions; and
first and second source/emitter regions of a semiconductor material of the first conductivity type adjacent the first and second channel regions, respectively, opposite the JFET region;
wherein the oxide layer comprises a central region over the JFET region, first and second inner peripheral regions adjacent the central region and over the first and second channel regions and first and second outer peripheral regions adjacent the first and second inner peripheral regions and opposite the central region over the source/emitter regions;
wherein the gate electrode layer extends over the JFET region and the adjacent channel regions and wherein the gate electrode layer has a first edge on the first outer peripheral region of the oxide layer and a second edge on the second outer peripheral region of the oxide layer;
wherein the oxide layer has a first average thickness in the central region and a second average thickness in the first and second inner peripheral regions, wherein the first average thickness is different than the second average thickness by at least 25%; with the proviso that: the second average thickness is greater than the first average thickness;
the first average thickness is greater than the second average thickness and the oxide layer has a third average thickness in the first and second outer peripheral regions, wherein the third average thickness is greater than the second average thickness by at least 25%; or the oxide layer extends below the upper surface of the drift layer.

2. The semiconductor device of claim 1, wherein the second average thickness is greater than the first average thickness.

3. The semiconductor device of claim 2, wherein the source/emitter region comprises: an inner region contiguous with the channel region underlying the central region of the oxide layer and an outer region contiguous with the inner region opposite the channel region and underlying the first or second peripheral region of the oxide layer; wherein the inner region and the outer region have different implant species, different implant levels and/or different levels of implantation induced damage.

4. The semiconductor device of claim 1, wherein the first average thickness is greater than the second average thickness and the oxide layer has a third average thickness in the first and second outer peripheral regions, wherein the third average thickness is greater than the second average thickness by at least 25%.

5. The semiconductor device of claim 1, wherein: the first average thickness is different than the second average thickness by at least 50%; the first average thickness is different than the second average thickness by at least 100%; the first average thickness is different than the second average thickness by at least 200%; or the first average thickness is different than the second average thickness by at least 300%.

6. The semiconductor device of claim 1, wherein the oxide layer extends below the upper surface of the drift layer.

7. The semiconductor device of claim 6, wherein the first average thickness is greater than the second average thickness.

8. The semiconductor device of claim 7, wherein the oxide layer has a third average thickness in the first and second outer peripheral regions, wherein the third average thickness is greater than the second average thickness by at least 25%.

9. The semiconductor device of claim 6, wherein the second average thickness is greater than the first average thickness.

10. The semiconductor device of claim 1, further comprising: a layer of semiconductor material of the second conductivity type between the drift layer and the substrate.

11. The semiconductor device of claim 1, wherein the semiconductor material of the first conductivity type is an n-type material and the semiconductor material of the second conductivity type is a p-type material.

12. The semiconductor device of claim 1, wherein the semiconductor material is a SiC semiconductor material.

13. The semiconductor device of claim 12, wherein the source/emitter regions are SiC doped with a dopant species selected from the group consisting of Nitrogen, Phosphorus and combinations thereof.

14. The semiconductor device of claim 12, wherein the source/emitter regions are SiC doped with phosphorus.

15. The semiconductor device of claim 12, wherein SiC under the gate electrode layer has been implanted with an implant species selected from the group consisting of nitrogen, phosphorous, silicon, carbon, argon and combinations thereof.

16. The semiconductor device of claim 12, wherein SiC under the gate electrode layer has been implanted with an electrically inactive species.

17. The semiconductor device of claim 1, wherein the one or more JFET regions, the first and second channel regions, and the first and second source/emitter regions are elongate regions extending in an x direction in the drift layer and spaced apart from one another in a y-direction perpendicular to the x-direction.

* * * * *